(12) United States Patent
Cumberland

(10) Patent No.: US 10,627,174 B2
(45) Date of Patent: Apr. 21, 2020

(54) SUBSTANTIALLY ALIGNED BORON NITRIDE NANO-ELEMENT ARRAYS

(71) Applicant: The Boeing Company, Seal Beach, CA (US)

(72) Inventor: Robert W. Cumberland, Malibu, CA (US)

(73) Assignee: The Boeing Company, Chicago, IL (US)

( * ) Notice: Subject to any disclaimer, the term of this patent is extended or adjusted under 35 U.S.C. 154(b) by 653 days.

(21) Appl. No.: 14/198,801

(22) Filed: Mar. 6, 2014

(65) Prior Publication Data

US 2014/0182823 A1 Jul. 3, 2014

Related U.S. Application Data

(62) Division of application No. 12/569,585, filed on Sep. 29, 2009, now Pat. No. 8,709,538.

(51) Int. Cl.

| | | |
|---|---|---|
| *B32B 9/00* | (2006.01) | |
| *F28F 13/18* | (2006.01) | |
| *C01B 35/14* | (2006.01) | |
| *H01L 23/42* | (2006.01) | |
| *H01L 23/373* | (2006.01) | |
| *C01B 32/18* | (2017.01) | |
| *C01B 32/168* | (2017.01) | |

(52) U.S. Cl.
CPC .......... *F28F 13/185* (2013.01); *C01B 32/168* (2017.08); *C01B 32/18* (2017.08); *C01B 35/146* (2013.01); *H01L 23/373* (2013.01); *H01L 23/42* (2013.01); *C01P 2004/13* (2013.01); *H01L 2924/0002* (2013.01); *Y10T 428/249921* (2015.04); *Y10T 428/25* (2015.01)

(58) Field of Classification Search
CPC ........ C01B 31/022–0293; C01B 21/06; C01B 35/00; B82Y 10/00; Y10T 428/30
USPC ........................................... 428/408; 165/185
See application file for complete search history.

(56) References Cited

U.S. PATENT DOCUMENTS

| | | |
|---|---|---|
| 5,021,300 A | 6/1991 | Stacey |
| 5,641,466 A | 6/1997 | Ebbesen et al. |
| 5,698,175 A | 12/1997 | Hiura et al. |
| 6,350,488 B1 | 2/2002 | Lee et al. |
| 6,420,092 B1 | 7/2002 | Yang et al. |
| 6,689,186 B1 | 2/2004 | Hampden-Smith et al. |
| 6,822,018 B2 | 11/2004 | Chaudhuri et al. |

(Continued)

FOREIGN PATENT DOCUMENTS

| | | |
|---|---|---|
| EP | 1186689 A1 | 3/2002 |
| WO | 2007036805 A2 | 4/2007 |
| WO | 2009035439 A1 | 3/2009 |

OTHER PUBLICATIONS

Bando Yoshio, (JP-2004-190183; English machine translation) Aug. 7, 2004.*

(Continued)

*Primary Examiner* — Daniel H Miller
(74) *Attorney, Agent, or Firm* — Armstrong Teasdale LLP

(57) ABSTRACT

Substantially aligned boron nitride nano-element arrays prepared by contacting a carbon nano-element array with a source of boron and nitrogen; methods for preparing such arrays and methods for their use including use as a heat sink or as a thermally conductivity interface in microelectronic devices.

15 Claims, 2 Drawing Sheets

(56) References Cited

U.S. PATENT DOCUMENTS

| | | | |
|---|---|---|---|
| 7,253,442 B2 | 8/2007 | Huang et al. | |
| 7,291,396 B2 | 11/2007 | Huang et al. | |
| 7,354,471 B2 | 4/2008 | Hampden-Smith et al. | |
| 7,393,428 B2 | 7/2008 | Huang et al. | |
| 7,396,477 B2 | 7/2008 | Hsiao | |
| 7,438,844 B2 | 10/2008 | Huang et al. | |
| 2001/0048172 A1 | 12/2001 | Smith et al. | |
| 2002/0084410 A1 | 7/2002 | Colbert et al. | |
| 2004/0067604 A1 | 4/2004 | Ouellet et al. | |
| 2004/0266065 A1 | 12/2004 | Zhang et al. | |
| 2005/0006754 A1* | 1/2005 | Arik | B82Y 10/00 257/712 |
| 2005/0040847 A1* | 2/2005 | Unger | B82Y 10/00 326/37 |
| 2005/0046017 A1 | 3/2005 | Dangelo | |
| 2005/0092464 A1* | 5/2005 | Leu | B82Y 10/00 165/80.3 |
| 2005/0126766 A1 | 6/2005 | Lee et al. | |
| 2007/0249755 A1 | 10/2007 | Hiroshige et al. | |
| 2008/0295959 A1 | 12/2008 | Ishigaki et al. | |
| 2010/0190023 A1* | 7/2010 | Gross | H01L 23/373 428/545 |

OTHER PUBLICATIONS

Single-walled B-doped carbon, BrN-doped carbon and BN nonotubes synthesized from single-walled carbon nanotubes through a substitution reaction D. Golberg, Y. Bando, Chemical Physics Letters 308 (1999) 337-342.*

International Search Report and Written Opinion of PCT/US2010/046363; dated Dec. 2, 2010; 14 pages.

Hackl, G. et al.; Coating of Carbon Short Fibers with Thin Ceramic Layers by Chemical Vapor Deposition; Thin Solid Films 513 (2006); pp. 217-222; www.sciencedirect.com; Elsevier 2006.

Zhao, G.; Chemical Vapor Deposition Fabrication and Characterization of Silica-Coated Carbon Fiber Ultramicroelectrodes; pp. 2592-2598; Analytical Chemistry, vol. 67. No. 15, Aug. 1, 1995.

* cited by examiner

SUBSTANTIALLY ALIGNED BORON NITRIDE NANO-ELEMENT ARRAYS

CROSS REFERENCE TO RELATED APPLICATIONS

This application is a divisional and claims priority to U.S. patent application Ser. No. 12/569,585 filed Sep. 29, 2009, and issued as U.S. Pat. No. 8,709,538 on Apr. 29, 2014, for "substantially aligned boron nitride nano-element arrays and methods for their use and preparation", which is hereby incorporated by reference in its entirety.

BACKGROUND

The field of this disclosure relates generally to substantially aligned boron nitride nano-element arrays and, particularly, to nano-element arrays prepared by contacting a carbon nano-element array with a source of boron and nitrogen. Other aspects include methods for preparing such arrays and methods for their use such as, for example, use as a heat sink or as a thermally conductivity interface in microelectronic devices.

Microelectronic devices are conventionally manufactured with materials such as, for example, gaskets, welds, greases, adhesives and pastes located between device components. These materials act as a thermal interface in that they dissipate heat away from the electronic components during use and store the heat until the device is no longer in use (i.e., act as a heat sink) and, additionally or alternatively, conduct heat from the component to a heat sink such as, for example, a copper heat sink, a graphite-based chip strap, a dielectric layer and the surface of the device.

Carbon nanotubes have been explored as a potential thermal interface in electronic devices. However, carbon nanotubes, in addition to being thermally conductive, are electrically conductive. As a result, when a portion of a carbon nanotube interface in conventional electronic devices dislodges due to collision, age or repeated transport of the device (e.g., as in handheld devices or devices used in transportation), the dislodged electrically conductive nanotubes may contact an active region of the device and may cause the device to short-circuit. Such events may potentially cause failure of the device.

A need exists for materials that are not electrically conductive but which have a high thermal conductivity, allowing the materials to be a heat sink for a heat-generating component or to act as thermal interface between the component and a heat sink. A need also exists for processes for preparing such arrays and for using the arrays in electrical devices.

BRIEF SUMMARY

One aspect of the present disclosure is directed to an array of substantially aligned boron nitride nano-elements. The array includes a plurality of substantially aligned carbon nano-elements at least partially coated with boron nitride. The boron nitride is formed a source of boron atoms and a source of nitrogen atoms. The source of boron atoms includes a boron containing compound selected from a group consisting of $BH_3$, $B_2H_4$, and $B_2H_6$.

Another aspect of the disclosure is directed to an electronic device including at least one of a heat-generating component and a heat sink, and an array of substantially aligned boron nitride nano-elements deposited on a surface of the at least one of a heat-generating component and a heat sink. The array includes a plurality of substantially aligned carbon nano-elements at least partially coated with boron nitride, the boron nitride formed from a source of boron atoms and a source of nitrogen atoms. The source of boron atoms comprises a boron containing compound selected from a group consisting of $BH_3$, $B_2H_4$, and $B_2H_6$.

The features, functions, and advantages that have been discussed can be achieved independently in various embodiments of the present disclosure or may be combined in yet other embodiments further details of which can be seen with reference to the following description and drawings.

DETAILED DESCRIPTION

Figure 1:
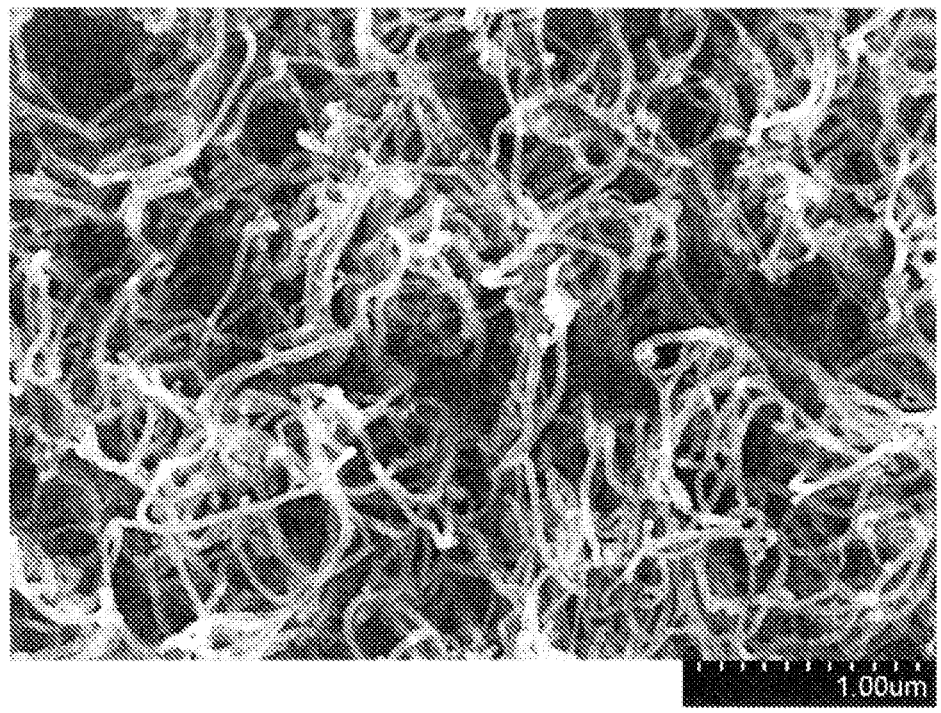
FIG. 1 is a scanning electron microscopy (SEM) image of a substantially aligned boron nitride nanotube array prepared according to Example 1.

Provisions of the present disclosure include substantially aligned boron nitride arrays of nano-elements for use in electronic components and methods for preparing and using such arrays. Generally, the substantially aligned boron nitride array may be produced by growing an array of carbon nano-elements on a substrate and contacting the array of carbon nano-elements with a precursor gas comprising a source of boron atoms and a source of nitrogen atoms. The source of boron atoms and nitrogen atoms may be the same compound or a boron-containing compound and a different nitrogen containing compound may be used as the precursor gas. The resulting substantially aligned boron nitride nano-element array is characterized by high thermal conductivity allowing the array to be used as a heat sink or a thermal pathway (i.e., thermal interface) and is electrically insulating which reduces the risk of short-circuiting the electronic devices.

In accordance with embodiments of the present disclosure, a first step of producing a boron nitride nanotube array includes growing a substantially aligned array of carbon nano-elements. The array may be grown directly on a substrate surface in which the boron nitride array is intended to be used such as, for example, the surface of a heat-generating component or heat sink of a microelectronic device, or may be grown on a substrate and then transferred to the component. Generally, the array may be grown by any of the methods known by those of ordinary skill in the art without limitation. The array may be grown by the methods disclosed in U.S. Pat. No. 6,350,488, which is incorporated herein for all relevant and consistent purposes.

In some embodiments, the substantially aligned carbon nano-element array is prepared by depositing a catalyst layer of iron, nickel, cobalt or alloys thereof on the surface of a substrate such as a silicon wafer or a heat-generating component or heat sink of a microelectronic device. The catalyst layer may be deposited by, for example, thermal deposition, reduction of a metal salt, chemical-vapor deposition, electron-beam deposition or sputtering. In certain embodiments, an insulating layer of alumina or silicon oxide is deposited prior to deposition of the catalyst layer.

The substrate and catalyst layer may be heated under an atmosphere of argon, hydrogen or a mixture thereof to melt the catalyst layer and form iron, nickel or cobalt nanoparticles (or nanodroplets) that act as seeds for growth of the carbon nano-elements. The substrate may be maintained at an elevated temperature and a mixture of inert gases, hydrogen and a carbon-containing source gas such as, for example, ethylene, acetylene, methane, propylene, methanol, ethanol and toluene, may be contacted with the substrate to form the carbon nano-elements. The carbon nano-elements may be grown at a temperature of at least about 400° C. and, in other embodiments, a temperature of at least about 600° C. or even at least about 700° C. and typically at temperatures less than about 1200° C., less than about 1000° C. or even less than about 800° C. (e.g., from about 600° C. to about 800° C.). Growth of the carbon nano-elements may occur at atmospheric pressures; however, pressures near vacuum or even of several atmospheres (e.g., 3 atmospheres) may be used. It should be noted that temperatures and pressures other than those listed above may be used to grow the nano-elements without departing from the scope of the present disclosure.

By the end of the growth run, a vertically aligned array of nano-elements forms on the surface of the substrate. Typically, carbon nanotubes grow and extend from the substrate but other nano-element shapes (e.g., rods, fibers, spheres and the like) may be produced without departing from the scope of the present disclosure.

Generally, the carbon nano-element array is substantially aligned. For purposes of the present disclosure, "substantially aligned" arrays comprise a plurality of nano-elements that extend in a generally common direction from a common substrate. It should be understood that distal portions of the nano-elements (i.e., the portions of the nano-elements most distant from the substrate) may bend, curl, twist and the like in a non-aligned manner (see FIG. 1) and that such arrays may still be considered to be "substantially aligned" in accordance with the present disclosure.

In embodiments where the carbon nano-elements are in the shape of nanotubes, the diameter (i.e., outside diameter) of the nanotubes may be less than about 50 nm and, in other embodiments, less than about 20 nm, from about 2 nm to about 100 µm, from about 2 nm to about 1 µm, from about 2 nm to about 500 nm, from about 2 nm to about 50 nm or from about 5 nm to about 20 nm. The height of the nanotubes may be at least about 25 nm and, in other embodiments, is at least about 100 nm, at least about 500 nm, at least about 1 µm, at least about 100 µm, at least about 500 µm, from about 25 nm to about 1 mm, from about 25 nm to about 1 cm, from about 100 nm to about 1 mm, from about 100 µm to about 1 mm or even from about 100 nm to about 500 µm.

Once the array of substantially aligned carbon nano-elements is prepared, the elements may be contacted with a precursor gas comprising a source of boron atoms and a source of nitrogen atoms. Without being bound to any particular theory, it is believed that the boron and nitrogen atoms either displace a number of the carbon atoms of the nano-element array or, alternatively or in addition, form an at least partial coating on the carbon atoms so as to electrically insulate the nano-element array. In other embodiments, boron nitride nano-elements may extend from the ends of the existing carbon nano-elements. For purposes of the present disclosure, "boron nitride nano-elements" and arrays thereof include elements and arrays produced by either the carbon displacement or carbon coating route or by extending boron nitride nanotubes from the ends of the carbon nanotubes. When boron nitride deposits as a coating, the coating may cover a portion of each nano-element or the entire surface of the nano-element and may cover some of the nano-elements or all of the nano-elements without limitation.

The precursor gas may be contacted with the carbon nano-element array under conditions suitable for chemical vapor deposition. Chemical vapor deposition (CVD) is generally known by the skilled artisan and a number of CVD techniques may be utilized such as, for example, plasma-enhanced CVD (PECVD), atmospheric-pressure CVD (APCVD), low- or reduced-pressure CVD (LPCVD), ultra-high-vacuum CVD (UHVCVD), atomic layer deposition (ALD) and aerosol assisted CVD (AACVD). Boron nitride may be applied by techniques other than CVD including, for example, sputtering. Liquid phase methods including sol-gel processes may also be utilized without departing from the scope of the present disclosure.

Generally, CVD methods involve introduction (typically continually) of precursor compounds at elevated temperatures at or near the surface of the substrate to which the material is to be applied. The precursor compounds react or decompose to deposit the material on the substrate surface or by displacing atoms in the substrate. The deposited material grows in thickness until compounds are no longer passed over the substrate at elevated temperatures. The precursor compounds for use in the present disclosure may generally be determined by one of ordinary skill in the art. For instance, compounds containing both boron and nitrogen may be used such as, for example, borazine ($B_3N_3H_6$), aminoborane ($NH_2BH_2$), or ammonia borane ($NH_3BH_3$). Alternatively, a first compound containing boron and a second compound containing nitrogen may be contacted with the substantially aligned carbon nano-element array. Boron compounds include, for example, boron trichloride ($BCl_3$) and compounds of the generic formula $B_xH_y$. In certain embodiments, x is from 1 to 10 and y is from 1 to 15. Examples of compounds of formula $B_xH_y$ include $BH_3$, $B_2H_4$, $B_2H_6$, $B_3H_8$, $B_4H_{10}$, $B_5H_9$, $B_5H_{11}$, $B_6H_{10}$, $B_6H_{12}$, $B_8H_{12}$, $B_9H_{15}$ and $B_{10}H_{14}$. Nitrogen compounds include, for example, $N_2$, $NH_3$ and hydrazine ($N_2H_4$).

The thickness of the material applied may be varied to ensure adequate electrical resistance of the boron nitride nano-elements and to ensure thermal conductivity is not degraded below desired levels. Generally, the thickness of the applied boron nitride (not including any non-displaced carbon atoms that form a portion of the nano-elements) may be at least about 10 nm and, in other embodiments, may be at least about 100 nm, at least about 500 nm, at least about 1 µm, at least about 10 µm or at least about 100 µm. In some embodiments, the thickness of the material applied is from about 10 nm to about 10 µm or from about 100 nm to about 1 µm.

In embodiments where the boron nitride nano-elements are in the shape of nanotubes, the outside diameter of the nanotubes (including any non-displaced carbon) may be less than about 50 nm and, in other embodiments, less than about 20 nm, from about 2 nm to about 100 µm, from about 2 nm to about 1 µm, from about 2 nm to about 500 nm, from about 2 nm to about 50 nm or from about 5 nm to about 20 nm. The height of the nanotubes may be at least about 25 nm and, in other embodiments, is at least about 100 nm, at least about 500 nm, at least about 1 µm, at least about 100 µm, at least about 500 µm, from about 25 nm to about 1 mm, from about 25 nm to about 1 cm, from about 100 nm to about 1 mm, from about 100 µm to about 1 mm or even from about 100 nm to about 500 µm.

The array of substantially aligned carbon nano-elements may be contacted with the precursor gas at a variety of temperatures and pressures depending on, for example, the deposition technique and the desired amount of boron nitride to be applied and the like. The carbon nano-element array may be contacted with the precursor gas at a temperature of from about 450° C. to about 1200° C., preferably from about 600° C. to about 1100° C. or even more preferably from about 600° C. to about 800° C.

In some embodiments, the carbon nano-elements may be contacted with the precursor gas at reduced pressures such as, for example, less than about atmospheric, less than about $10^4$ Pa, less than about 250 Pa, less than about 1 Pa, less than about $10^{-1}$ Pa or even less than about $10^{-6}$ Pa. The carbon nano-elements may be contacted with the precursor gas at atmospheric pressures or even at pressure above atmospheric such as at least about $2\times10^5$ Pa.

In certain embodiments, a portion of the substantially aligned boron nitride nano-element array contains carbon atoms that were not displaced by boron and nitrogen atoms. The amount of carbon atoms displaced (i.e., the amount of carbon atoms dislodged from the nano-element structure and which may be disposed of in an exhaust gas) may be at least about 5% of the carbon atoms of the nano-element before contact with the precursor gas and, in other embodiments, may be at least about 10%, at least about 25%, at least about 50% or even at least about 75% of the carbon atoms of the nano-element before contact with the precursor gas. In certain embodiments, substantially all of the carbon atoms are displaced with boron and nitrogen atoms and, in others, substantially none of the carbon atoms are displaced (i.e., boron nitride deposits purely as a coating).

The boron nitride nanotubes may contain less than about 75% carbon by weight and, in other embodiments, less than about 50%, less than about 25%, less than about 5% carbon by weight, from about 5% to about 95%, from about 5% to about 75% or from about 5% to about 50% by weight carbon. In some embodiments, the boron nitride nano-elements substantially do not contain any carbon (i.e., only residual amounts of carbon will be present).

In certain embodiments, space between the boron nitride nano-elements may be filled with a filler material. The filler material may be injected or coated within the nano-element array. Suitable fillers include, for example, silica gel, polyethylene glycol, polyester, epoxy resins and acrylics.

Generally, the carbon nano-element array may be grown directly on a component (e.g., a heat-generating component of a microelectronic device) and then contacted with the boron- and nitrogen-containing precursor gas. Alternatively, the substantially aligned carbon nano-element array may be deposited on the component by forming the carbon nano-elements on a substrate and then transferring the nano-element array onto the surface of the component. In such embodiments, the carbon nano-element array may be contacted with the precursor gas to convert the carbon nano-element array to a boron nitride nano-element array before transfer to the surface of the component or before transfer without limitation.

Any of the methods known by those of ordinary skill in the art to transfer a previously formed nano-element array or boron nitride nano-element array may be utilized in accordance with the present disclosure. The array may be transferred to the surface of the component (e.g., heat-generating component or heat sink) according to methods described in U.S. patent application Ser. No. 12/359,662, filed Jan. 26, 2009, and published as U.S. Patent Pub. No. 2010/0190023, the contents of which are incorporated herein by reference for all relevant and consistent purposes. For instance, the nano-element array may be grown on a substrate (e.g., silicon wafer, glass, metal or metal oxide) and a layer of a first metal may be applied to a first end of the nano-elements. After the first layer is applied, a layer of a second metal is applied to the layer of the first metal. The first layer and the second layer may be independent selected from a layer of gold, silver, bismuth copper, tin, germanium cadmium, indium, zinc and alloys thereof with the first layer being different than the second layer. The array is then transferred by applying the layer of the second metal to the surface of the component (e.g., heat-generating component or heat sink). A compressive force is applied across the nano-elements, the metal layers, and the component. The temperature of the nano-elements, the metal layers and the substrate is elevated such that the metal layers form at least one of a eutectic bond, a metal solid solution, and an alloy bond between the nano-elements and the surface of the component. The substrate may be removed from the second end of the nano-elements by etching or by a mechanical peeling process (i.e., adhesion plus application of force). Other methods for transferring the substantially aligned carbon or boron nitride array may be utilized without departing from the scope of the present disclosure.

In embodiments where the array is transferred before contact with the precursor gas, the precursor gas may be contacted with the carbon nano-element after transfer to the component (e.g., heat-generating component or heat sink).

The substantially aligned boron nitride nanotube array may be used in electronic devices and may replace conventionally used heat sinks and thermal interface materials. The arrays may be used as a heat sink or a thermal pathway (e.g., thermal interface) between electronic components (e.g., MMIC chips, resistors, microprocessors and the like) or between an electronic component and a heat sink (e.g., chip strap, dielectric layer). The substantially aligned boron nitride nano-element array may be used in electronic devices used in the airline industry due to their characteristic light weight, high durability and short-circuit protection. While the boron nitride nano-element arrays have been generally described in use with electrical devices, other uses are contemplated and within the scope of the present disclosure.

EXAMPLES

Example 1

Preparation of a Substantially Aligned Boron Nitride Nanotube Array

A silicon wafer was coated with 10 nm of $Al_2O_3$ and 2 nm of iron. A mixture of hydrogen and argon was passed over the surface of the wafer at 700° C. for 10 minutes to clean the surface of the wafer and prepare catalyst droplets. A mixture of ethylene, hydrogen and argon was then contacted with the silicon wafer at 700° C. to grow a substantially aligned carbon nanotube array 50 μm in length. The substrate and carbon nanotubes were loaded into a 1" diameter quartz tube and heated to 700° C. under a constant flow of hydrogen (150 cm$^3$/min) and argon (150 cm$^3$/min) for 10 minutes.

Figure 2:
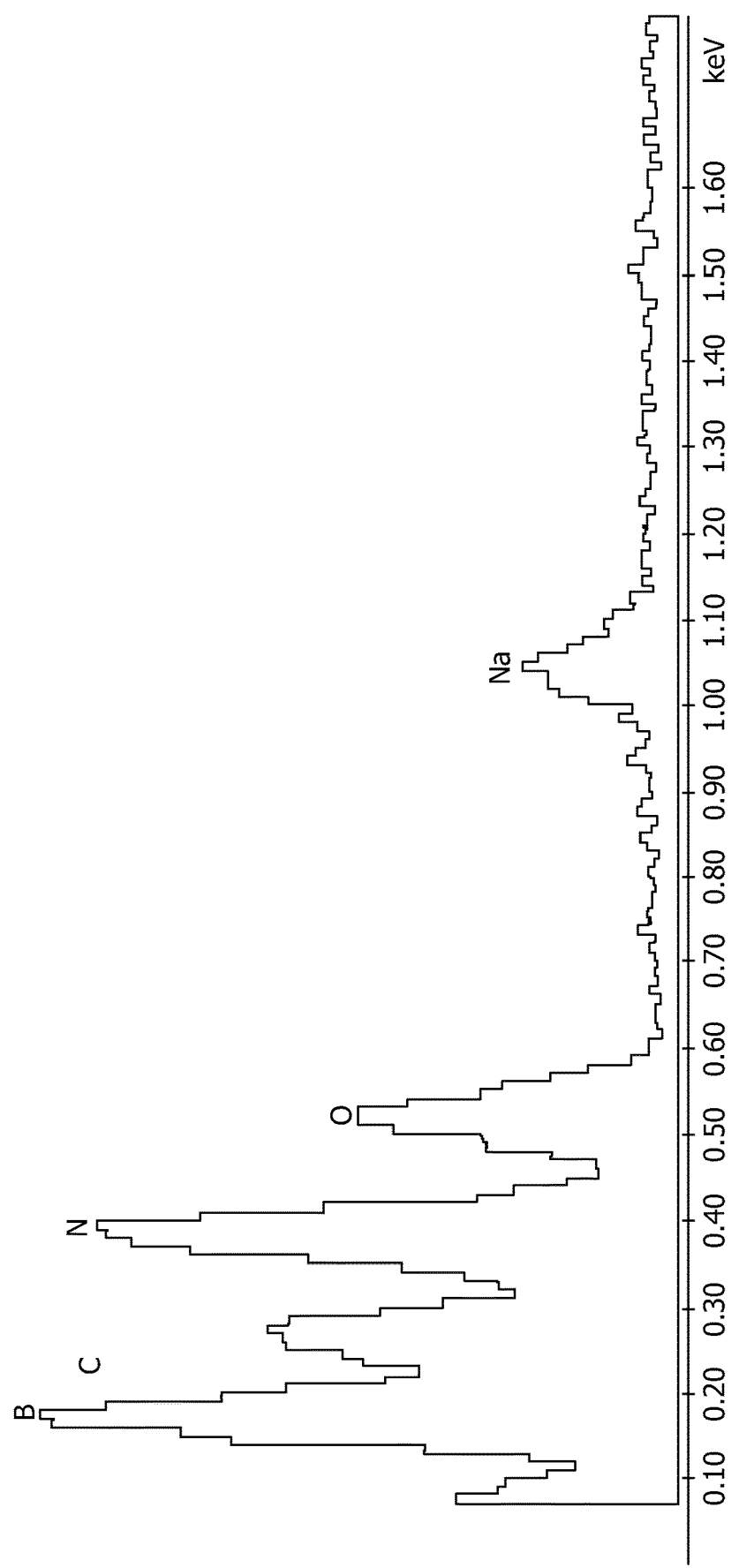
FIG. 2 is a graphical depiction of the Energy Dispersive Spectroscopy (EDAX) analysis of the substantially aligned boron nitride nanotube array prepared according to Example 1.

After the 10 minutes, the argon stream was bubbled through a borazine bubbler and fed through the tube with the hydrogen gas. The temperature of the tube was raised to 1000° C. for 10 minutes. The nanotubes appeared to have a grey cast. The array was imaged by scanning electron microscopy (SEM) (FIG. 1). As can be seen from the image, no crystalline or amorphous boron nitride formed. EDAX elemental analysis (FIG. 2) showed a boron peak and a nitrogen peak which were both greater in intensity than the carbon peak. This indicates that the majority of the array contained boron and nitrogen and that the carbon from the carbon nanotubes was heavily substituted with boron nitride or that the boron nitride nanotubes had grown from the ends of the carbon nanotubes.

This written description uses examples to disclose various embodiments, which include the best mode, to enable any person skilled in the art to practice those embodiments, including making and using any apparatus, devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. As various changes could be made in the above compositions and methods without departing from the scope of the disclosure, it is intended that all matter contained in the above description and shown in the accompanying figures shall be interpreted as illustrative and not in a limiting sense When introducing elements of the present disclosure or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

What is claimed is:

1. An array of substantially aligned boron nitride nano-elements, the array comprising:
   a plurality of substantially aligned carbon nano-elements; and
   a plurality of boron nitride nano-elements formed on, and extending from, ends of said plurality of substantially aligned carbon nano-elements, the boron nitride formed from a source of boron atoms and a source of nitrogen atoms, wherein the source of boron atoms comprises a boron containing compound selected from a group consisting of $BH_3$, $B_2H_4$, and $B_2H_6$.

2. The array of claim 1 wherein the array extends from a substrate.

3. The array of claim 1 wherein the nano-elements are nanotubes.

4. The array of claim 3 wherein the diameter of the nanotubes is from about 5 nm to about 20 nm.

5. The array of claim 3 wherein the length of the nanotubes is from about 100 nm to about 100 μm.

6. The array of claim 3 wherein the source of nitrogen atoms comprises a nitrogen containing compound selected from the group consisting of $N_2$, $NH_3$ and $N_2H_4$.

7. An electronic device comprising:
   at least one of a heat-generating component and a heat sink; and
   an array of substantially aligned boron nitride nano-elements deposited on a surface of the at least one of a heat-generating component and a heat sink, the array comprising:
      a plurality of substantially aligned carbon nano-elements; and
      a plurality of boron nitride nano-elements formed on, and extending from, ends of said plurality of substantially aligned carbon nano-elements, the boron nitride formed from a source of boron atoms and a source of nitrogen atoms, wherein the source of boron atoms comprises a boron containing compound selected from a group consisting of $BH_3$, $B_2H_4$, and $B_2H_6$.

8. The electronic device of claim 7 further comprising:
   a layer of a first metal applied to a first end of the substantially aligned carbon nano-elements; and
   a layer of a second metal applied to a surface of the at least one of a heat-generating component and a heat sink.

9. The electronic device of claim 8 wherein the layer of the first metal and the layer of the second metal are pressed together at an elevated temperature such that the metal layers form at least one of a eutectic bond, a metal solid solution, and an alloy bond between the substantially aligned carbon nano-elements and the surface of the at least one of a heat-generating component and a heat sink.

10. The electronic device of claim 7 wherein the array extends from a substrate.

11. The electronic device of claim 7 wherein the substantially aligned carbon nano-elements are nanotubes.

12. The electronic device of claim 11 wherein a diameter of the nanotubes is from about 5 nm to about 20 nm.

13. The electronic device of claim 11 wherein a length of the nanotubes is from about 100 nm to about 100 μm.

14. The electronic device of claim 7 wherein the source of nitrogen atoms comprises a nitrogen containing compound selected from the group consisting of $N_2$, $NH_3$ and $N_2H_4$.

15. The array of claim 1, wherein said carbon nano-elements comprises carbon in an amount less than or equal to about 75 percent by weight of said carbon nano-elements.

* * * * *